(12) United States Patent
Chan et al.

(10) Patent No.: US 8,498,600 B2
(45) Date of Patent: Jul. 30, 2013

(54) AUTOMATIC GAIN CONTROL SYSTEM WITH DUAL-RSSI INTERFERENCE DETECTION FOR OPTIMIZATION OF SENSITIVITY AND ADJACENT CHANNEL REJECTION PERFORMANCE OF RF RECEIVERS

(75) Inventors: Chung Kei Thomas Chan, Hsin-Chu (TW); Wei-Ling Chiang, Hsin-Chu (TW)

(73) Assignee: Infomax Communication Co., Ltd., Hsinchu (TW)

(*) Notice: Subject to any disclaimer, the term of this patent is extended or adjusted under 35 U.S.C. 154(b) by 105 days.

(21) Appl. No.: 13/159,921

(22) Filed: Jun. 14, 2011

(65) Prior Publication Data

US 2012/0034894 A1 Feb. 9, 2012

Related U.S. Application Data

(60) Provisional application No. 61/370,468, filed on Aug. 4, 2010.

(51) Int. Cl.
*H04B 17/00* (2006.01)
*H04B 1/06* (2006.01)

(52) U.S. Cl.
USPC ............. 455/226.3; 455/67.11; 455/232.1

(58) Field of Classification Search
USPC .......... 455/67.11, 150.1, 226.1, 226.3, 232.1, 455/234.1, 245.1; 375/345
See application file for complete search history.

(56) References Cited

U.S. PATENT DOCUMENTS

| | | | |
|---|---|---|---|
| 7,242,915 B2 | 7/2007 | Shi | |
| 7,924,944 B2* | 4/2011 | Vassiliou et al. | 375/345 |
| 8,009,776 B2* | 8/2011 | Gao et al. | 375/345 |
| 8,063,997 B2* | 11/2011 | Lindstrom et al. | 455/241.1 |
| 8,169,546 B2* | 5/2012 | Fu et al. | 375/345 |

* cited by examiner

*Primary Examiner* — Quochien B Vuong
(74) *Attorney, Agent, or Firm* — Rabin & Berdo, P.C.

(57) ABSTRACT

A tuner includes a low noise amplifier (LNA), a first received signal strength indicator (RSSI), a mixer, an intermediate frequency (IF) filter, a second RSSI and an adjustment unit. The LNA amplifies a radio frequency (RF) signal. The first RSSI detects received signal strength indication of the RF signal and obtains a first signal strength voltage. The mixer is coupled to the LNA and down-converts the RF signal into a first IF signal according to a local oscillation frequency. The IF filter is coupled to the mixer and filters the first IF signal to obtain a second IF signal. The second RSSI detects received signal strength indication of the second IF signal and obtains a second signal strength voltage. The adjustment unit adjusts a gain of the LNA according to the first signal strength voltage and the second signal strength voltage.

9 Claims, 6 Drawing Sheets

AUTOMATIC GAIN CONTROL SYSTEM WITH DUAL-RSSI INTERFERENCE DETECTION FOR OPTIMIZATION OF SENSITIVITY AND ADJACENT CHANNEL REJECTION PERFORMANCE OF RF RECEIVERS

This application claims the benefit of a provisional application Ser. No. 61/370,468, filed Aug. 4, 2010, the subject matter of which is incorporated herein by reference.

BACKGROUND

1. Technical Field

The invention relates in general to a tuner and a gain adjustment method thereof.

2. Background

The orthogonal frequency division multiplexing (OFDM) modulation technology can be used in digital video broadcasting systems to perform high spectral efficiency transmission. Based on the OFDM modulation technology for the multi-carrier modulation, the effective processing ability is obtained with respect to the multi-path reflection effect. So, the OFDM system has recently become the mainstream technology in the digital video broadcasting application development. Various systems, such as the Digital Video Broadcasting-Terrestrial (DVB-T), the Integrated Service Digital Broadcasting-Terrestrial (ISDB-T) and the China Mobile Multimedia Broadcasting (CMMB), use the OFDM transmission technology.

To provide desirable quality of video, all digital video systems have stringent requirements on adjacent channel interference rejection and sensitivity. To meet the stringent requirements, RF receivers are designed to have good noise figure (NF), third-order intercept point (IIP3) and 1-dB compression point (P1 dB). However, there are trade-offs among the above-mentioned figures of merits related to the gain of the RF front-end circuits such as a low noise amplifier (LNA). For example, as the gain increases, NF improves but the linearity (IIP3 and P1 dB) gets worse and vice versa. Hence, automatic gain control mechanism is proposed to adjust the gain of the RF front-end circuits appropriately.

A timing based LNA gain adjustment in an RF receiver, as shown in FIG. 1, is disclosed in U.S. Pat. No. 7,242,915 B2. The LNA gain adjustment circuit executes the gain tuning mechanism at guard periods without read data. The above-mentioned method may be applicable for the Global System for Mobile Communication (GSM) with no strong adjacent channel interference, however, the method with no gain adjustment during data frames is not suitable for digital TV systems with strong adjacent channel interference and rapidly varying signal power. In addition, the mixer may filter out the far away interference, so that the received signal strength indicator (RSSI_A) can no longer accurately represent the influence of the interference and is unable to adjust the gain of the LNA appropriately.

SUMMARY

The disclosure is directed to a tuner and a gain adjustment method thereof, capable of automatically optimizing the gain setting of the tuner by detecting power of wanted signals and unwanted interference.

According to a first aspect of the present disclosure, a tuner is provided. The tuner includes a low noise amplifier (LNA), a first received signal strength indicator (RSSI), a mixer, an intermediate frequency (IF) filter, a second RSSI and an adjustment unit. The LNA is used for amplifying a radio frequency (RF) signal. The first RSSI is used for detecting received signal strength indication of the amplified RF signal to obtain a first signal strength voltage. The mixer is coupled to the LNA and used for down-converting the amplified RF signal into a first IF signal according to a local oscillation frequency. The IF filter is coupled to the mixer and used for filtering the first IF signal to obtain a second IF signal. The second RSSI is used for detecting received signal strength indication of the second IF signal to obtain a second signal strength voltage. The adjustment unit is used for adjusting a gain of the LNA according to the first signal strength voltage and the second signal strength voltage.

According to a second aspect of the present disclosure, a gain adjustment method of a tuner is provided. The tuner includes an LNA, a first RSSI, a mixer coupled to the LNA, an IF filter coupled to the mixer, a second RSSI and an adjustment unit. The gain adjustment method includes the following steps. The LNA is utilized to amplify an RF signal. The first RSSI is utilized to detect received signal strength indication of the amplified RF signal and a first signal strength voltage is obtained. The mixer is utilized to down-convert the amplified RF signal into a first IF signal according to a local oscillation frequency. The IF filter is utilized to filter the first IF signal to obtain a second IF signal. The second RSSI is utilized to detect received signal strength indication of the second IF signal and a second signal strength voltage is obtained. The adjustment unit is utilized to adjust a gain of the LNA according to the first signal strength voltage and the second signal strength voltage.

The invention will become apparent from the following detailed description of the preferred but non-limiting embodiments. The following description is made with reference to the accompanying drawings.

DETAILED DESCRIPTION OF THE INVENTION

The disclosure proposes a tuner and a gain adjustment method thereof, utilizing multiple received signal strength detectors to respectively detect power of wanted signals and unwanted interference, thus capable of appropriately and automatically optimizing the gain setting of the tuner.

Figure 1:
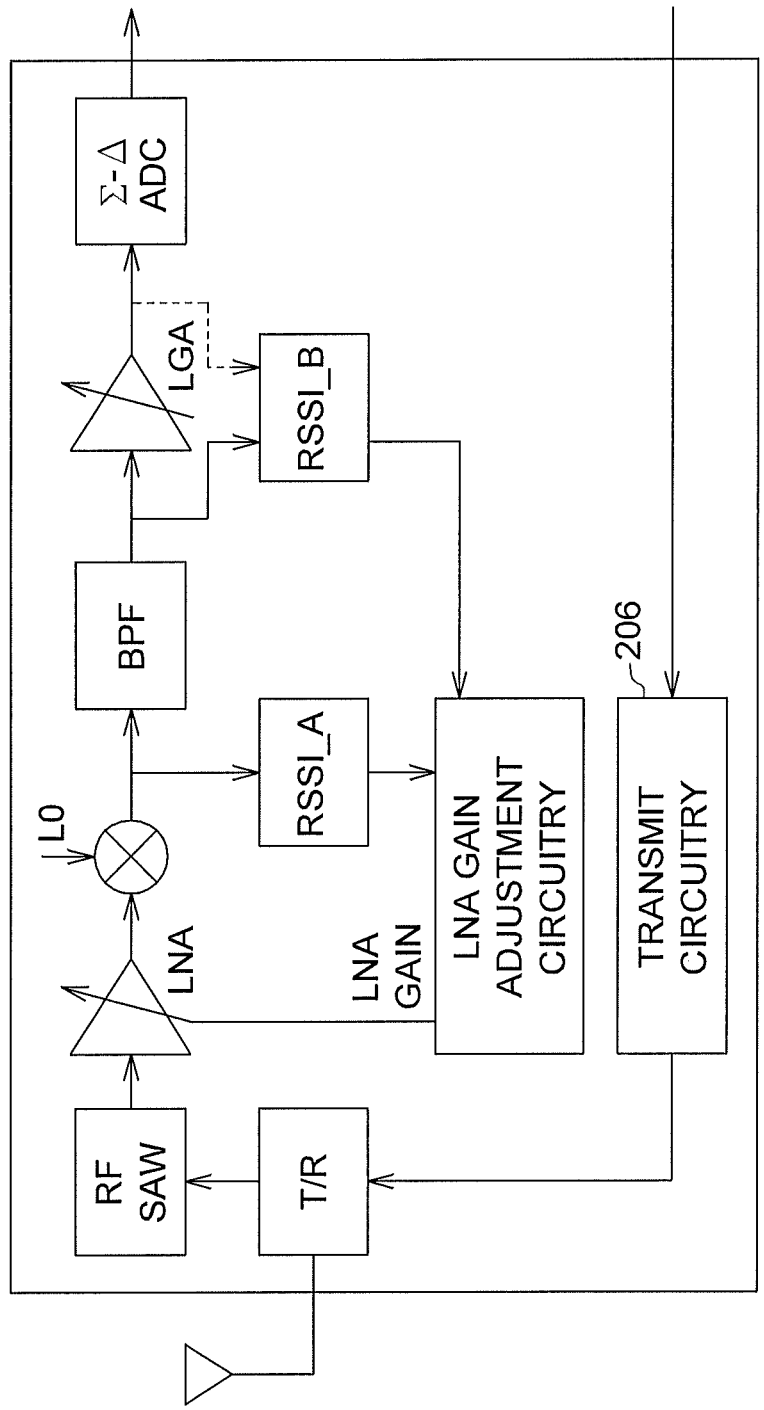
FIG. 1 is a conventional timing based LNA gain adjustment in an RF receiver.
Figure 2:
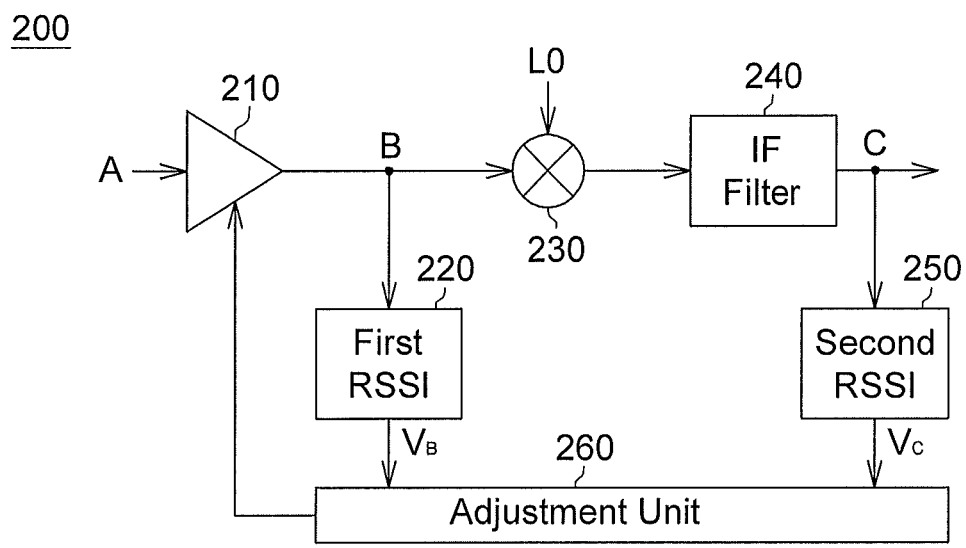
FIG. 2 shows a function block diagram illustrating a tuner according to an embodiment.

Referring to FIG. 2, a function block diagram illustrating a tuner according to an embodiment is shown. The tuner 200, substantially a front-end circuit of a radio frequency (RF) receiver, includes a low noise amplifier (LNA) 210, a first received signal strength indicator (RSSI) 220, a mixer 230, an intermediate frequency (IF) filter 240, a second RSSI 250 and an adjustment unit 260. The LNA 210 receives and amplifies an RF signal, which may include wanted signals and unwanted interference. The first RSSI 220 detects received signal strength indication of the amplified RF signal and then transforms it into a first signal strength voltage $V_B$. The received signal strength indication of the amplified RF signal at the node B may include power of the wanted signals and the unwanted interference.

The mixer 230 is coupled to the LNA 210 and down-converts the amplified RF signal into a first IF signal according to a local oscillation frequency LO. The IF filter 240 is coupled to the mixer 230 and filters the first IF signal to obtain a second IF signal. The second RSSI 250 detects received signal strength indication of the second IF signal and transforms it into a second signal strength voltage $V_C$. Because the unwanted interference should be filtered out theoretically by the IF filter 240, the received signal strength indication of the second IF signal at the node C should only include power of the wanted signals. The adjustment unit 250 adjusts a gain of the LNA 210 according to information of the first signal strength voltage $V_B$ and the second signal strength voltage $V_C$.

Figure 3:
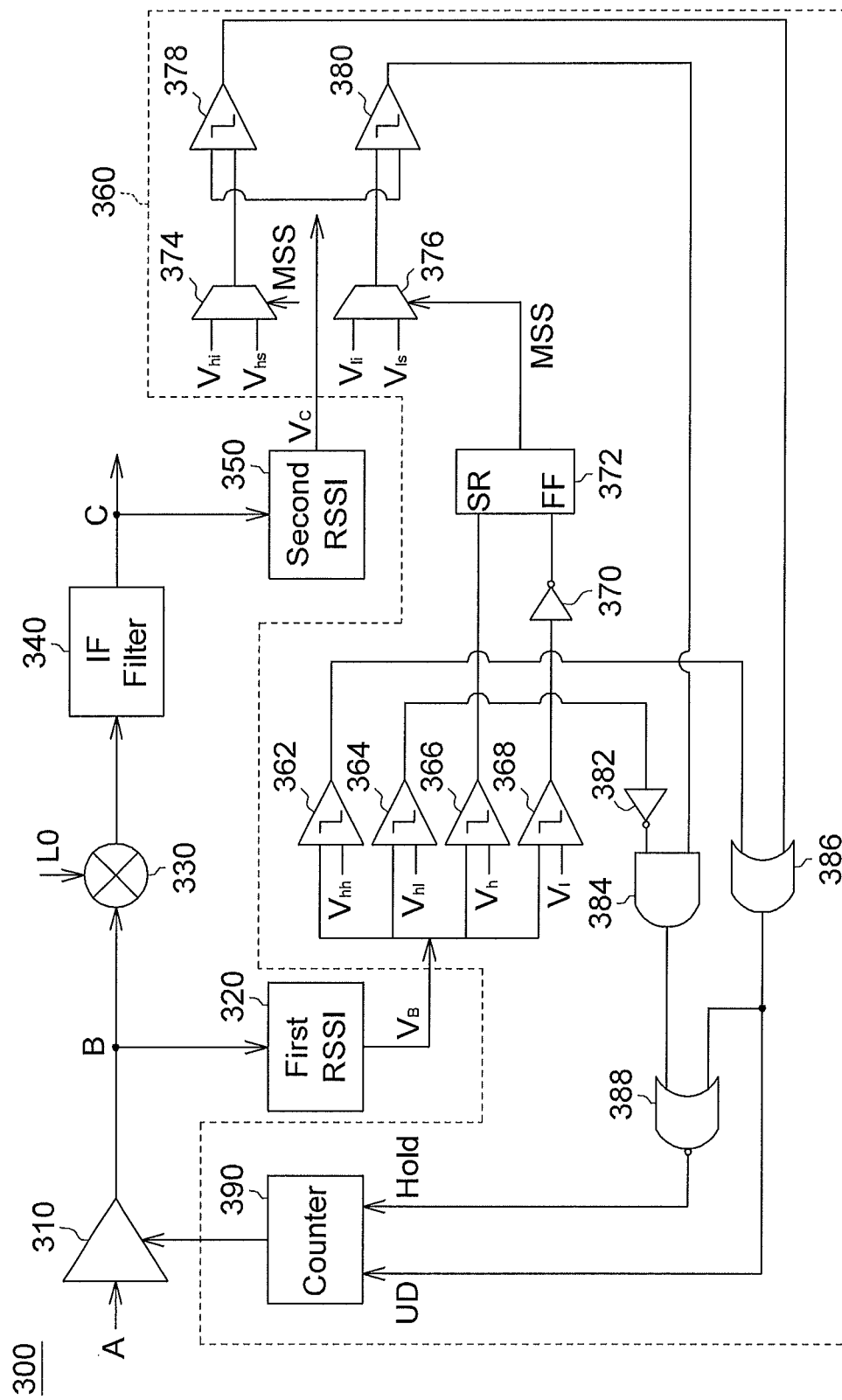
FIG. 3 shows a circuit diagram illustrating a tuner according to an embodiment.

Referring to FIG. 3, a circuit diagram illustrating a tuner according to an embodiment is shown. In FIG. 3, the tuner 300, having similar element components with the tuner 200, includes an LNA 310, a first RSSI 320, a mixer 330, an IF filter 340, a second RSSI 350 and an adjustment unit 360. The adjustment unit 360 includes a first comparator 362, a second comparator 364, a third comparator 366, a fourth comparator 368, a first inverter 370, an SR-Flip-Flop 372, a first multiplexer 374, a second multiplexer 376, a fifth comparator 378, a sixth comparator 380, a second inverter 382, an AND gate 384, an OR gate 386, a NOR gate 388 and a counter 390.

The first comparator 362 compares the first signal strength voltage $V_B$ with a second threshold $V_{hh}$. The second comparator 364 compares the first signal strength voltage $V_B$ with a first threshold $V_{hl}$. The third comparator 366 compares the first signal strength voltage $V_B$ with a fourth threshold $V_h$. The fourth comparator 368 compares the first signal strength voltage $V_B$ with a third threshold $V_l$. The first inverter 370 is coupled to an output terminal of the fourth comparator 368. The SR-Flip-Flop 372 has a first input terminal coupled to an output terminal of the third comparator 366, a second input terminal coupled to an output terminal of the first inverter 370, and an output terminal for outputting a mode selection signal MSS.

The first multiplexer 374 and the second multiplexer 376 outputs a first set of reference values ($V_{hi}$, $V_{li}$) or a second set of reference values ($V_{hs}$, $V_{ls}$) according to the mode selection signal MSS. The fifth comparator 378 and the sixth comparator 380 compare the second signal strength voltage $V_C$ with the first set of reference values ($V_{hi}$, $V_{li}$) or the second set of reference values ($V_{hs}$, $V_{ls}$). The second inverter 382 is coupled to an output terminal of the second comparator 364. The AND gate 384 has a first input terminal coupled to an output terminal of the second inverter 382 and a second input terminal coupled to an output terminal of the sixth comparator 380.

The OR gate 386 has a first input terminal coupled to an output terminal of the first comparator 362 and a second input terminal coupled to an output terminal of the fifth comparator 378. The NOR gate 388 has a first input terminal coupled to an output terminal of the AND gate 384 and a second input terminal coupled to an output terminal of the OR gate 386. The counter 390 adjusts the gain of the LNA 310 according to outputs of the OR gate 386 and the NOR gate 388.

Figure 4:
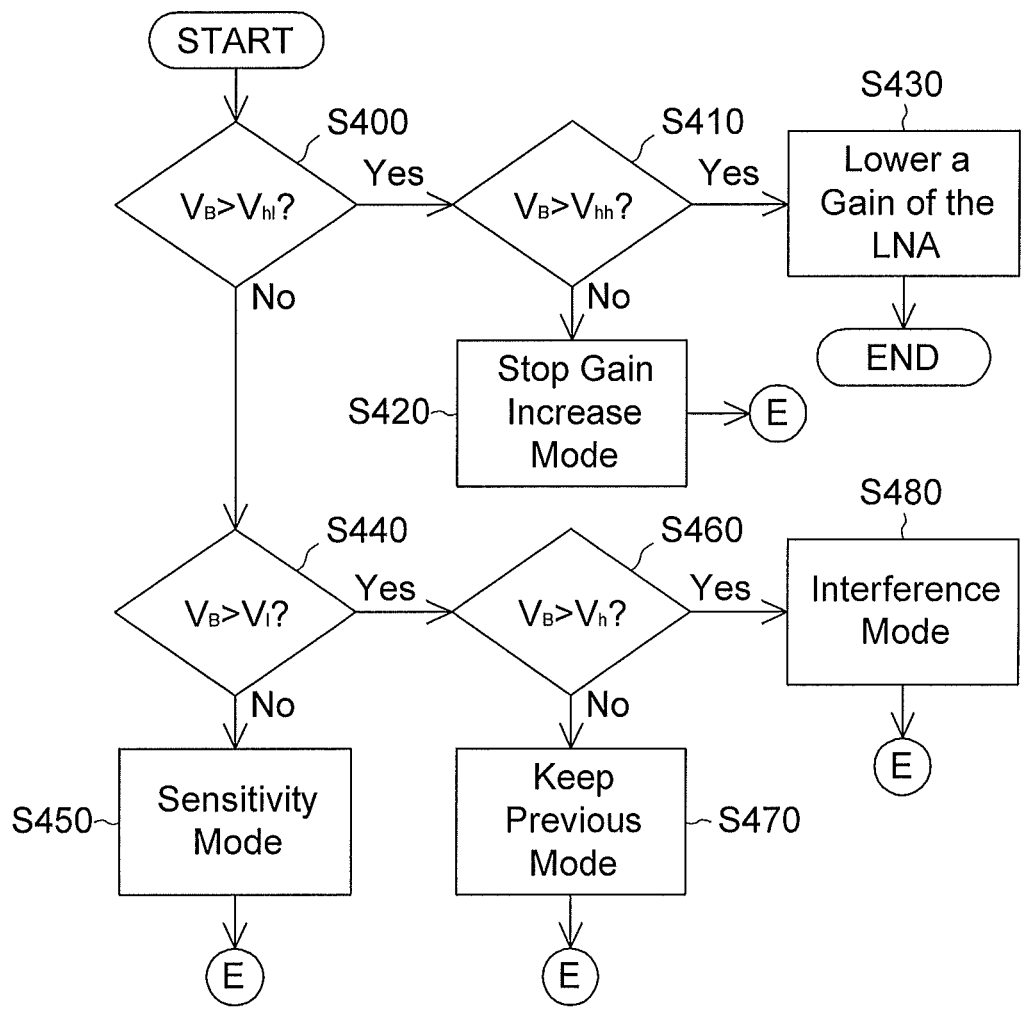
FIG. 4 and FIG. 5 show a flow chart of a gain adjustment method of a tuner according to an embodiment.
Figure 5:
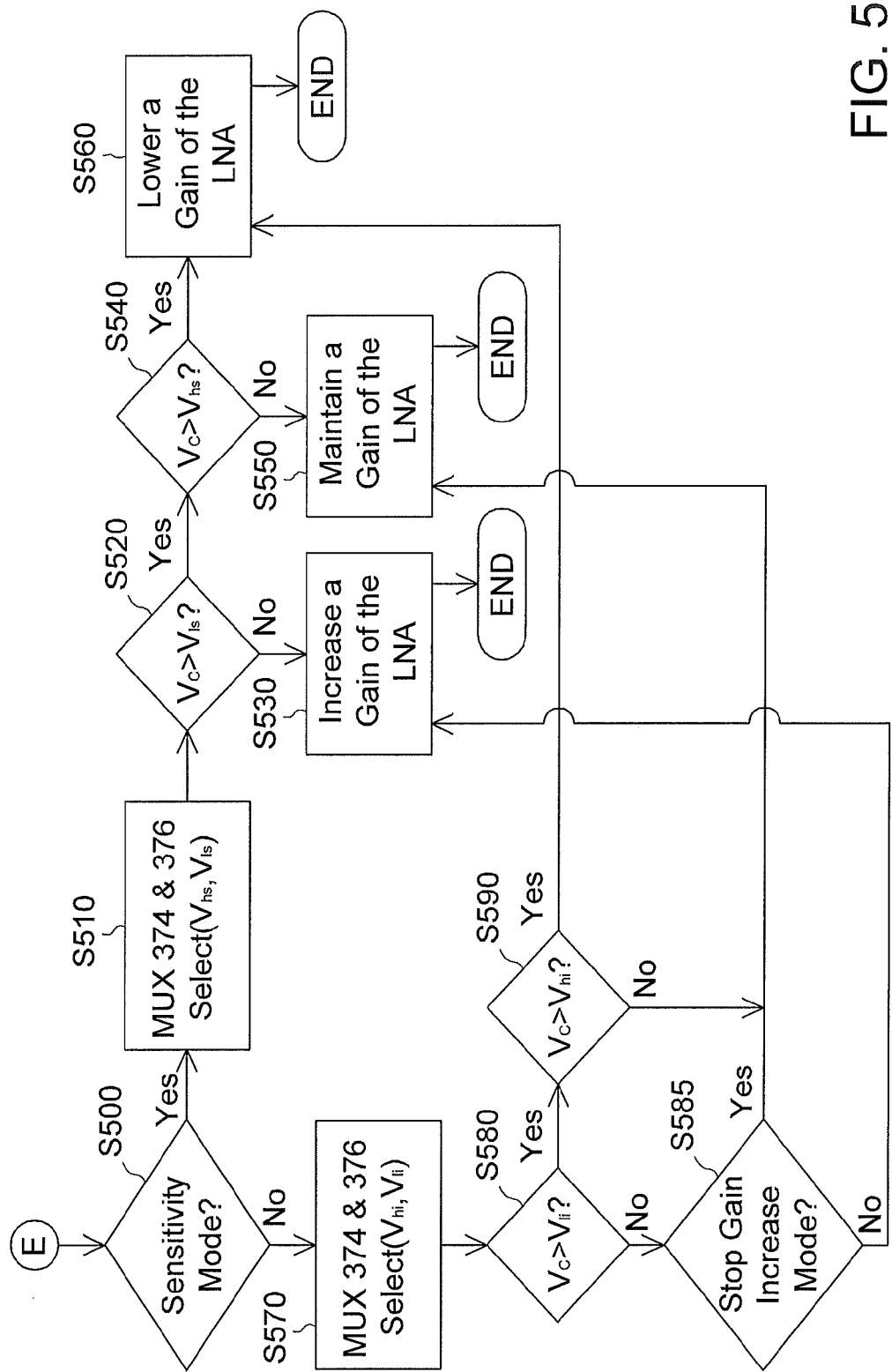

Referring concurrently now to FIGS. 3, 4 and 5, flow charts of a gain adjustment procedure of a tuner according to an embodiment are shown in FIGS. 4 and 5. The procedures shown in FIGS. 4 and 5 are substantially occurred recursively at each clock cycle. Assume that the mixer 330 has a 20-dB fixed gain, and the IF filter 340 has zero gain, but it is not limited thereto and may be designed according to the user's requirements. There are some moments, such as the RF receiver is near a base station, when the RF receiver encounters RF signals with extremely large power levels. Such RF signals with extremely large power levels may saturate the tuner 300 and ruin the total performance of the RF receiver. Therefore, in step S400, the adjustment unit 360 determines whether the tuner 300 enters a high-power mode according to whether the first signal strength voltage $V_B$ is higher than the first threshold $V_{hl}$. The first signal strength voltage $V_B$ corresponds to the received signal strength indication of the amplified RF signal at the node B. If the tuner 300 enters the high-power mode, the adjustment unit 360 maintains or lowers the gain of the LNA 310 to cause the tuner 300 to operate linearly.

In step S410, the adjustment unit 360 determines whether the first signal strength voltage $V_B$ is higher than the second threshold $V_{hh}$. When the first signal strength voltage $V_B$ is higher than the first threshold $V_{hl}$ and lower than the second threshold $V_{hh}$, the output of the AND gate 384 is 0, the output HOLD of the NOR gate 388 is 1, and the counter 390 maintains the gain of the LNA 310, thus in step S420, the tuner 300 enters a stop gain increase mode. When the first signal strength voltage $V_B$ is higher than the second threshold $V_{hh}$, the output UD of the OR gate 386 is 1, the output HOLD of the NOR gate 388 is 0, and the counter 390 lowers the gain of the LNA 310 in step S430. Assume that the P1 dB of the mixer 330 is −10 dBm, and the tuner 300 enters the high-power mode as the received signal strength indication of the amplified RF signal at the node B reaches −10 dBm. In other words, the first threshold $V_{hl}$, such as 850.2 mV corresponding to −10 dBm at the node B, and the second threshold $V_{hh}$, such as 890.6 mV corresponding to −7 dBm at the node B, are in charge of the operation of the high-power mode. When the first signal strength voltage $V_B$ is lower than the first threshold $V_{hl}$, the output of the AND gate 384 is determined by the sixth comparator 380.

If the tuner does not enter the high-power mode, the adjustment unit 360 detects whether the tuner 300 is in a sensitivity mode or an interference mode according to the first signal strength voltage $V_B$. In step S440, the adjustment unit 360 determines whether the first signal strength voltage $V_B$ is higher than the third threshold $V_l$. When the first signal strength voltage $V_B$ is lower than the third threshold $V_l$, the tuner 300 enters the sensitivity mode in step S450. Otherwise, in step S460, the adjustment 360 determines whether the first signal strength voltage $V_B$ is higher than the fourth threshold $V_h$. When the first signal strength voltage $V_B$ is lower than the fourth threshold $V_h$, the tuner 300 keeps being in the previous mode in step S470. When the first signal strength voltage $V_B$ is higher than the fourth threshold $V_h$, the tuner 300 enters the interference mode in step S480.

Afterwards, the adjustment unit 360 adjusts the gain of the LNA 310 according to the second signal strength voltage $V_C$. For the sensitivity test, the power of the RF signal is small and there is no adjacent channel interference and only sufficient noise figure is required. Therefore, the gain of the LNA 310 may be set to maximum. Assume that the RF signal only includes the wanted signals without the unwanted interference, and a gain table of the LNA for the sensitivity mode is shown as Table 1. It can be obtained from Table 1 that the RF receiver can receive the RF signal properly for all gain codes if input power is higher than −82 dBm.

TABLE 1

| Gain Code | LNA Gain (dB) | Node A (dBm) | Node B (dBm) | Node C (dBm) | Sensitivity (dBm) |
|---|---|---|---|---|---|
| 0 | 28 | −85 | −57.00 | −37.00 | −82.56 |
| 0 | 28 | −84 | −56.00 | −36.00 | −82.56 |
| 0 | 28 | −83 | −55.00 | −35.00 | −82.56 |
| 0 | 28 | −82 | −54.00 | −34.00 | −82.56 |
| 0 | 28 | −81 | −53.00 | −33.00 | −82.56 |
| 0 | 28 | −80 | −52.00 | −32.00 | −82.56 |
| 0 | 28 | −79 | −51.00 | −31.00 | −82.56 |
| 0 | 28 | −78 | −50.00 | −30.00 | −82.56 |
| 0 | 28 | −77 | −49.00 | −29.00 | −82.56 |
| 1 | 27 | −76 | −49.00 | −29.00 | −82.16 |
| 2 | 26 | −75 | −49.00 | −29.00 | −81.73 |
| 3 | 25 | −74 | −49.00 | −29.00 | −80.81 |
| 4 | 24 | −73 | −49.00 | −29.00 | −80.34 |
| 5 | 23 | −72 | −49.00 | −29.00 | −79.80 |
| 6 | 22 | −71 | −49.00 | −29.00 | −79.18 |
| 7 | 21 | −70 | −49.00 | −29.00 | −78.55 |
| 8 | 20 | −69 | −49.00 | −29.00 | −77.87 |
| 9 | 19 | −68 | −49.00 | −29.00 | −77.09 |
| 10 | 18 | −67 | −49.00 | −29.00 | −76.30 |
| 11 | 17 | −66 | −49.00 | −29.00 | −75.54 |
| 12 | 16 | −65 | −49.00 | −29.00 | −74.80 |
| 13 | 15 | −64 | −49.00 | −29.00 | −74.09 |
| 14 | 14 | −63 | −49.00 | −29.00 | −73.37 |
| 15 | 13 | −62 | −49.00 | −29.00 | −72.55 |
| 16 | 12 | −61 | −49.00 | −29.00 | −71.75 |
| 17 | 11 | −60 | −49.00 | −29.00 | −70.86 |
| 18 | 10 | −59 | −49.00 | −29.00 | −69.91 |
| 19 | 9 | −58 | −49.00 | −29.00 | −69.10 |
| 20 | 8 | −57 | −49.00 | −29.00 | −68.02 |
| 21 | 7 | −56 | −49.00 | −29.00 | −67.09 |
| 22 | 6 | −55 | −49.00 | −29.00 | −66.02 |
| 23 | 5 | −54 | −49.00 | −29.00 | −65.02 |
| 24 | 4 | −53 | −49.00 | −29.00 | −64.02 |
| 25 | 3 | −52 | −49.00 | −29.00 | −63.02 |
| 26 | 2 | −51 | −49.00 | −29.00 | −60.02 |
| 27 | 1 | −50 | −49.00 | −29.00 | −59.02 |
| 28 | 0 | −49 | −49.00 | −29.00 | −58.02 |
| 29 | −1 | −48 | −49.00 | −29.00 | −57.02 |
| 30 | −2 | −47 | −49.00 | −29.00 | −56.02 |
| 31 | −3 | −46 | −49.00 | −29.00 | −55.02 |
| 32 | −4 | −45 | −49.00 | −29.00 | −54.02 |
| 33 | −5 | −44 | −49.00 | −29.00 | −53.02 |
| 34 | −6 | −43 | −49.00 | −29.00 | −52.02 |
| 35 | −7 | −42 | −49.00 | −29.00 | −51.02 |
| 36 | −8 | −41 | −49.00 | −29.00 | −50.02 |

Assume that the input power at which the tuner 300 starts to reduce the gain is an "attack point", and then the attack point in Table 1 is set to be −77 dBm. When the input power at the node A is lower than −77 dBm, the gain of the LNA 310 is kept at 28 dB; when the input power at the node A is higher than −77 dBm, the gain of the LNA 310 starts to reduce. Meanwhile, the power at the nodes B and C remain the same as the input power is higher than the attack point. At the attack point, the power at the node B is −49 dBm and the power at node C is −29 dBm. The third threshold $V_l$ is, for example, the voltage 244.9 mV corresponding to the power −49 dBm at the node B. Based on the power −29 dBm at the node C with consideration to ±2 dBm hysteresis, the first set of reference values ($V_{hs}$, $V_{ls}$) is, for example, the voltages (648.5 mV, 594.6 mV) corresponding to (−27 dBm, −31 dBm).

Assume that the RF signal includes the wanted signals and the unwanted interference, and the power of the unwanted interference is set to be 20 dBm. The power at the node B increases with the unwanted interference starting from −49 dBm at the attack point. When the power at the node B is higher than −29 dBm, the tuner 300 enters the interference mode. The fourth threshold $V_h$ is, for example, the voltage 513.9 mV corresponding to the power −29 dBm at the node B. The mixer 330 needs to be protected from saturation in the presence of large unwanted interference. Therefore, for the same wanted signal power, the gain of the LNA 310 in the interference mode should be lower than that in the sensitivity mode. In other words, the attack point is reduced when the tuner 300 enters the interference mode from the sensitivity mode. If the attack point is set to be −85 dBm, a gain table of the LNA for the interference is shown as Table 2. It can be obtained from Table 2 that the RF receiver can receive the RF signal properly for all gain codes if input power is higher than −79 dBm.

TABLE 2

| Gain Code | LNA Gain (dB) | Wanted Signal (dBm) | Node A (dBm) | Node B (dBm) | Node C (dBm) | Sensitivity (dBm) |
|---|---|---|---|---|---|---|
| 0 | 28 | −85 | −65 | −37.00 | −37.00 | −82.56 |
| 1 | 27 | −84 | −64 | −37.00 | −37.00 | −82.16 |
| 2 | 26 | −83 | −63 | −37.00 | −37.00 | −81.73 |
| 3 | 25 | −82 | −62 | −37.00 | −37.00 | −80.81 |
| 4 | 24 | −81 | −61 | −37.00 | −37.00 | −80.34 |
| 5 | 23 | −80 | −60 | −37.00 | −37.00 | −79.80 |
| 6 | 22 | −79 | −59 | −37.00 | −37.00 | −79.18 |
| 7 | 21 | −78 | −58 | −37.00 | −37.00 | −78.55 |
| 8 | 20 | −77 | −57 | −37.00 | −37.00 | −77.87 |
| 9 | 19 | −76 | −56 | −37.00 | −37.00 | −77.09 |
| 10 | 18 | −75 | −55 | −37.00 | −37.00 | −76.30 |
| 11 | 17 | −74 | −54 | −37.00 | −37.00 | −75.54 |
| 12 | 16 | −73 | −53 | −37.00 | −37.00 | −74.80 |
| 13 | 15 | −72 | −52 | −37.00 | −37.00 | −74.09 |
| 14 | 14 | −71 | −51 | −37.00 | −37.00 | −73.37 |
| 15 | 13 | −70 | −50 | −37.00 | −37.00 | −72.55 |
| 16 | 12 | −69 | −49 | −37.00 | −37.00 | −71.75 |
| 17 | 11 | −68 | −48 | −37.00 | −37.00 | −70.86 |
| 18 | 10 | −67 | −47 | −37.00 | −37.00 | −69.91 |
| 19 | 9 | −66 | −46 | −37.00 | −37.00 | −69.10 |
| 20 | 8 | −65 | −45 | −37.00 | −37.00 | −68.02 |
| 21 | 7 | −64 | −44 | −37.00 | −37.00 | −67.09 |
| 22 | 6 | −63 | −43 | −37.00 | −37.00 | −66.02 |
| 23 | 5 | −62 | −42 | −37.00 | −37.00 | −65.02 |
| 24 | 4 | −61 | −41 | −37.00 | −37.00 | −64.02 |
| 25 | 3 | −60 | −40 | −37.00 | −37.00 | −61.02 |
| 26 | 2 | −59 | −39 | −37.00 | −37.00 | −60.02 |
| 27 | 1 | −58 | −38 | −37.00 | −37.00 | −59.02 |
| 28 | 0 | −57 | −37 | −37.00 | −37.00 | −58.02 |
| 29 | −1 | −56 | −36 | −37.00 | −37.00 | −57.02 |
| 30 | −2 | −55 | −35 | −37.00 | −37.00 | −56.02 |
| 31 | −3 | −54 | −34 | −37.00 | −37.00 | −55.02 |
| 32 | −4 | −53 | −33 | −37.00 | −37.00 | −54.02 |
| 33 | −5 | −52 | −32 | −37.00 | −37.00 | −53.02 |
| 34 | −6 | −51 | −31 | −37.00 | −37.00 | −52.02 |
| 35 | −7 | −50 | −30 | −37.00 | −37.00 | −51.02 |
| 36 | −8 | −49 | −29 | −37.00 | −37.00 | −50.02 |

When the wanted power at the node A is higher than −85 dBm (the attack point), the gain of the LNA 310 starts to reduce and the power at the nodes B and C are kept. At the attack point, the power at the node C is −37 dBm. Based on the power −37 dBm at the node C with consideration to ±2 dBm hysteresis, the second set of reference values ($V_{hi}$, $V_{li}$) is, for example, the voltages (541.4 mV, 487.8 mV) corresponding to (−35 dBm, −39 dBm).

Referring to FIG. 5, in step S500, whether the tuner 300 is in the sensitivity mode is determined. As mentioned above, when the first signal strength voltage $V_B$ is lower than the third threshold $V_l$, the tuner 300 enters the sensitivity mode, and in step S510, the SR-FF 372 is reset, the first multiplexer 374 and the second multiplexer 376 output the first set of reference values ($V_{hs}$, $V_{ls}$) and the adjustment unit 360 adjusts the gain of the LNA 310 according to the second signal strength voltage $V_C$ and the first set of reference values ($V_{hs}$, $V_{ls}$) to maximize the sensitivity of the tuner 300 with higher gain setting. In step S520, the adjustment unit 360 determines whether the second signal strength voltage $V_C$ is higher than the reference value $V_{ls}$.

When the second signal strength voltage $V_C$ is not higher than the reference value $V_{ls}$, the adjustment unit 360 increases the gain of the LNA 310 in step S530. When the second signal strength voltage $V_C$ is higher than the reference value $V_{ls}$, the adjustment unit 360 determines whether the second signal strength voltage $V_C$ is higher than the reference value $V_{hs}$ in step S540. When the second signal strength voltage $V_C$ is not higher than the reference value $V_{hs}$, the adjustment unit 360 maintains the gain of the LNA 310 in step S550. When the second signal strength voltage $V_C$ is higher than the reference value $V_{hs}$, the adjustment unit 360 lowers the gain of the LNA 310 in step S560.

When the first signal strength voltage $V_B$ is higher than the fourth threshold $V_h$ and lower than the first threshold $V_{hl}$, the tuner enters the interference mode, the SR-FF 372 is set, the first multiplexer 374 and the second multiplexer 376 output the second set of reference values $(V_{hi}, V_{li})$ and the adjustment unit 360 adjusts the gain of the LNA 310 according to the second signal strength voltage $V_C$ and the second set of reference values $(V_{hi}, V_{li})$ to maximize the linearity of the tuner 300 with lower gain setting.

When the tuner 300 is not in the sensitivity mode, the first multiplexer 374 and the second multiplexer 376 output the second set of reference values $(V_{hi}, V_{li})$ in step S570 following step S500. In step S580, the adjustment unit 360 determines whether the second signal strength voltage $V_C$ is higher than the reference value $V_{li}$. When the second signal strength voltage $V_C$ is not higher than the reference value $V_{li}$, in step S585, the adjustment unit 360 determines whether the tuner 300 is in the stop gain increase mode. If yes, then proceeding to step S550, the adjustment unit 360 maintains the gain of the LNA 310; otherwise, then proceeding to step S530, the adjustment unit 360 increases the gain of the LNA 310. When the second signal strength voltage $V_C$ is higher than the reference value $V_{li}$, in step S590, the adjustment unit 360 determines whether the second signal strength voltage $V_C$ is higher than the reference value $V_{hi}$. If yes, then proceeding to step S560, the adjustment unit 360 lowers the gain of the LNA 310; otherwise, then proceeding to step S550, the adjustment unit 360 maintains the gain of the LNA 310.

Figure 6:
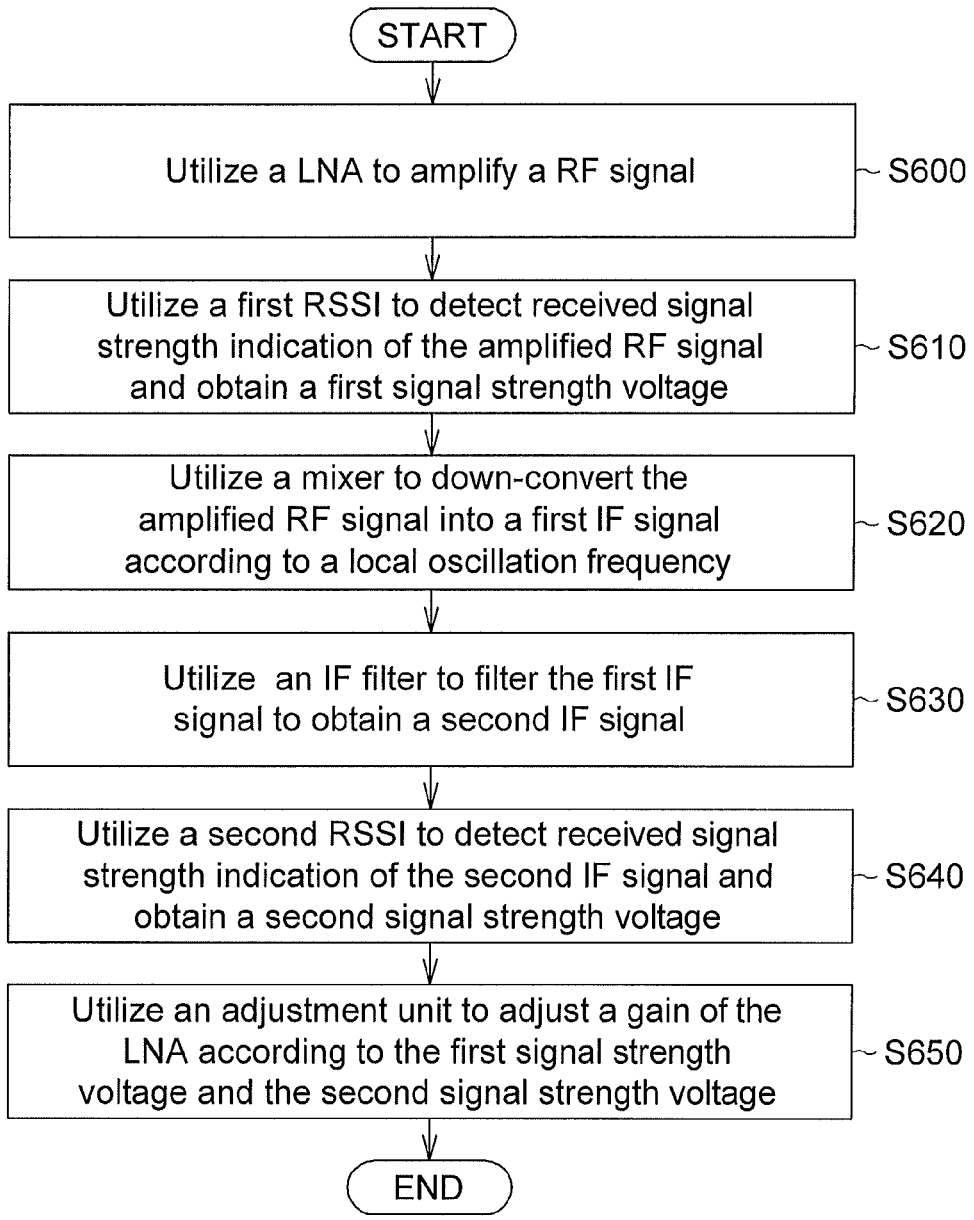
FIG. 6 shows a flow chart of a gain adjustment method of a tuner according to an embodiment.

The disclosure further proposes a gain adjustment method of a tuner. The tuner includes an LNA, a first RSSI, a mixer coupled to the LNA, an IF filter coupled to the mixer, a second RSSI and an adjustment unit. Referring to FIG. 6, a flow chart of a gain adjustment method of a tuner according to an embodiment is shown. The gain adjustment method includes the following steps. In step S600, the LNA is utilized to amplify an RF signal. In step S610, the first RSSI is utilized to detect received signal strength indication of the amplified RF signal and a first signal strength voltage is obtained. In step S620, the mixer is utilized to down-convert the amplified RF signal into a first IF signal according to a local oscillation frequency. In step S630, the IF filter is utilized to filter the first IF signal to obtain a second IF signal. In step S640, the second RSSI is utilized to detect received signal strength indication of the second IF signal and a second signal strength voltage is obtained. In step S650, the adjustment unit is utilized to adjust a gain of the LNA according to the first signal strength voltage and the second signal strength voltage.

The operational principles of above-mentioned gain adjustment method of the tuner have been described in the tuner 200 of FIG. 2, the tuner 300 of FIG. 3 and the related contents, so detailed descriptions thereof will be omitted.

The embodiments disclosed in the disclosure propose a tuner and a gain adjustment method thereof, respectively detecting power of the wanted signals and the unwanted interference after the LNA and detecting power of the wanted signals after the IF filter by different received signal strength detectors, thus capable of appropriately and automatically optimizing the gain setting of the tuner according to the detected results.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A tuner, comprising:
a low noise amplifier (LNA) for amplifying a radio frequency (RF) signal;
a first received signal strength indicator (RSSI) for detecting a received signal strength indication of the amplified RF signal and obtaining a first signal strength voltage;
a mixer coupled to the LNA and for down-converting the amplified RF signal into a first intermediate frequency (IF) signal according to a local oscillation frequency;
an IF filter coupled to the mixer and for filtering the first IF signal to obtain a second IF signal;
a second RSSI for detecting received signal strength indication of the second IF signal and obtaining a second signal strength voltage; and
an adjustment unit for adjusting a gain of the LNA according to the first signal strength voltage and the second signal strength voltage,
wherein when the adjustment unit judges that the first signal strength voltage is higher than a first threshold and lower than a second threshold, the tuner enters a high-power mode, and the adjustment unit maintains or lowers the gain of the LNA according to the first signal strength voltage to cause the tuner to operate linearly.

2. The tuner according to claim 1, wherein when the adjustment unit judges that the first signal strength voltage is higher than the second threshold, the adjustment unit lowers the gain of the LNA according to the first signal strength voltage to cause the tuner to operate linearly.

3. The tuner according to claim 1, wherein when the adjustment unit judges the first signal strength voltage is lower than a third threshold, the tuner enters a sensitivity mode, and the adjustment unit adjusts the gain of the LNA according to the second signal strength voltage and a first set of reference values corresponding to the sensitivity mode to maximize the sensitivity of the tuner with higher gain setting.

4. The tuner according to claim 3, wherein when the adjustment unit judges the first signal strength voltage is higher than a fourth threshold and lower than the first threshold, the tuner enters an interference mode, and the adjustment unit adjusts the gain of the LNA according to the second signal strength voltage and a second set of reference values corresponding to the interference mode to maximize the linearity of the tuner with lower gain setting.

5. The tuner according to claim 4, wherein the adjustment unit comprising:
a first comparator for comparing the first signal strength voltage with the second threshold;
a second comparator for comparing the first signal strength voltage with the first threshold;
a third comparator for comparing the first signal strength voltage with the fourth threshold;
a fourth comparator for comparing the first signal strength voltage with the third threshold;

a first inverter coupled to an output terminal of the fourth comparator;

an SR-Flip-Flop having a first input terminal coupled to an output terminal of the third comparator, a second input terminal coupled to an output terminal of the first inverter and an output terminal for outputting a mode selection signal;

a first multiplexer and a second multiplexer for outputting the first set of reference values and the second set of reference values according to the mode selection signal;

a fifth comparator and a sixth comparator for comparing the second signal strength voltage with the first set of reference values or the second set of reference values;

a second inverter coupled to an output terminal of the second comparator;

an AND gate having a first input terminal coupled to an output terminal of the second inverter, and a second input terminal coupled to an output terminal of the sixth comparator;

an OR gate having a first input terminal coupled to an output terminal of the first comparator, and a second input terminal coupled to an output terminal of the fifth comparator;

an NOR gate having a first input terminal coupled to an output terminal of the AND gate, and a second input terminal coupled to an output terminal of the OR gate; and a counter for adjusting the gain of the LNA according to outputs of the OR gate and the NOR gate.

6. A gain adjustment method of a tuner, the tuner comprising an LNA, a first RSSI, a mixer coupled to the LNA, an IF filter coupled to the mixer, a second RSSI and an adjustment unit, the gain adjustment method comprising:

utilizing the LNA to amplify an RF signal;

utilizing the first RSSI to detect a received signal strength indication of the amplified RF signal and obtain a first signal strength voltage;

utilizing the mixer to down-convert the amplified RF signal into a first IF signal according to a local oscillation frequency;

utilizing the IF filter to filter the first IF signal to obtain a second IF signal;

utilizing the second RSSI to detect a received signal strength indication of the second IF signal and obtain a second signal strength voltage; and utilizing the adjustment unit to adjust a gain of the LNA according to the first signal strength voltage and the second signal strength voltage, wherein the adjustment unit maintains or lowers the gain of the LNA according to the first signal strength voltage to cause the tuner to operate linearly as the tuner enters a high-power mode when the adjustment unit judges that the first signal strength voltage is higher than a first threshold and lower than a second threshold.

7. The gain adjustment method according to claim 6, further comprising:

utilizing the adjustment unit to lower the gain of the LNA according to the first signal strength voltage to cause the tuner to operate linearly when the adjustment unit judges that the first signal strength voltage is higher than the second threshold.

8. The gain adjustment method according to claim 6, further comprising:

utilizing the adjustment unit to adjust the gain of the LNA according to the second signal strength voltage and a first set of reference values corresponding to a sensitivity mode to maximize the sensitivity of the tuner with higher gain setting as the tuner enters the sensitivity mode when the adjustment unit judges the first signal strength voltage is lower than a third threshold.

9. The gain adjustment method according to claim 8, further comprising:

utilizing the adjustment unit to adjust the gain of the LNA according to the second signal strength voltage and a second set of reference values corresponding to an interference mode to maximize the linearity of the tuner with lower gain setting as the tuner enters the interference mode when the adjustment unit judges the first signal strength voltage is higher than a fourth threshold, the fourth threshold lower than the first threshold.

* * * * *